(12) United States Patent
Verma

(10) Patent No.: US 10,380,283 B2
(45) Date of Patent: Aug. 13, 2019

(54) FUNCTIONAL VERIFICATION WITH MACHINE LEARNING

(71) Applicant: Mentor Graphics Corporation, Wilsonville, OR (US)

(72) Inventor: Gaurav Kumar Verma, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 124 days.

(21) Appl. No.: 15/426,434

(22) Filed: Feb. 7, 2017

(65) Prior Publication Data
US 2018/0225394 A1 Aug. 9, 2018

(51) Int. Cl.
*G06F 17/50* (2006.01)
(52) U.S. Cl.
CPC ................. *G06F 17/5022* (2013.01)
(58) Field of Classification Search
CPC ............... G06F 17/504; G06F 17/5009; G06F 17/5022; G06F 17/5036; G06F 17/5045
USPC ........................................................ 716/106
See application file for complete search history.

(56) References Cited

U.S. PATENT DOCUMENTS

| 8,413,088 B1* | 4/2013 | Armbruster | G06F 17/504 716/100 |
| 2010/0031209 A1* | 2/2010 | Luan | G06F 17/5031 716/113 |

* cited by examiner

*Primary Examiner* — Paul Dinh
(74) *Attorney, Agent, or Firm* — Mentor Graphics Corporation

(57) ABSTRACT

This application discloses a computing system to select a design block in a circuit design of an electronic device for functional verification result reuse based on isolating operational characteristics of the design block. The computing system can determine whether the selected design block was previously simulated with input stimulus. When the selected design block was previously simulated with the input stimulus, the computing system can bypass the simulation of the design block and utilize an output generated in the previous simulation of the selected design block in response to the input stimulus as a result for the simulation of the design block. When the selected design block was not previously simulated with the input stimulus, the computing system can simulate the selected design block with the input stimulus, and storing an output generated in the simulation of the selected design block for functional verification result reuse.

17 Claims, 5 Drawing Sheets

FUNCTIONAL VERIFICATION WITH MACHINE LEARNING

TECHNICAL FIELD

This application is generally related to electronic design automation and, more specifically, to functional verification with machine learning.

BACKGROUND

Designing and fabricating electronic systems typically involves many steps, known as a design flow. The particular steps of a design flow often are dependent upon the type of electronic system being designed, its complexity, the design team, and the fabricator or foundry that will manufacture the electronic system. The design flow typically starts with a specification for a new circuit, which can be transformed into a logical design. The logical design can model the circuit at a register transfer level (RTL), which is usually coded in a Hardware Description Language (HDL), such as System Verilog, Very high speed integrated circuit Hardware Description Language (VHDL), System C, or the like.

The logical design can be functionally verified, for example, utilizing a design verification tool, which can simulate the functionality of the logical design in response to various test stimulus. The design verification tool also may simulate a test bench, which can generate different test stimulus and provide the test stimulus to the simulated logical design. The design verification tool can record signal states and transitions of the simulated logical design, often called waveform data, which can be analyzed to determine whether the logical design operated differently than expected in response to the test stimulus. When the output from the simulated logical design was different than expected, a designer can review in an attempt to identify a "bug" in the logical design. When the "bug" is located and fixed, or the logical design is otherwise modified, the functional verification process can restart, sometimes to re-verify the entire logical design.

The design verification tool also can record coverage events that occurred during simulation with the test bench, which can identify how well the test stimulus exercised the functionality of the logical design. The designer can review the recorded coverage events to identify holes or gaps in coverage for the test bench, and generate new test benches that can attempt to exercise the functionality in the logical design differently to fill the holes or gaps in the coverage. Both debugging and coverage can motivate designers to undergo the time-consuming process of iteratively simulating the logical design with different test stimulus before considering the logical design functionally verified.

SUMMARY

This application discloses a computing system to select a design block in a circuit design of an electronic device for functional verification result reuse based on isolating operational characteristics of the design block. The computing system can determine whether the selected design block was previously simulated with input stimulus. When the selected design block was previously simulated with the input stimulus, the computing system can bypass the simulation of the design block and utilize an output generated in the previous simulation of the selected design block in response to the input stimulus as a result for the simulation of the design block. When the selected design block was not previously simulated with the input stimulus, the computing system can simulate the selected design block with the input stimulus, and storing an output generated in the simulation of the selected design block for functional verification result reuse. Embodiments will be described in greater detail below.

DETAILED DESCRIPTION

Illustrative Operating Environment

Figure 1:
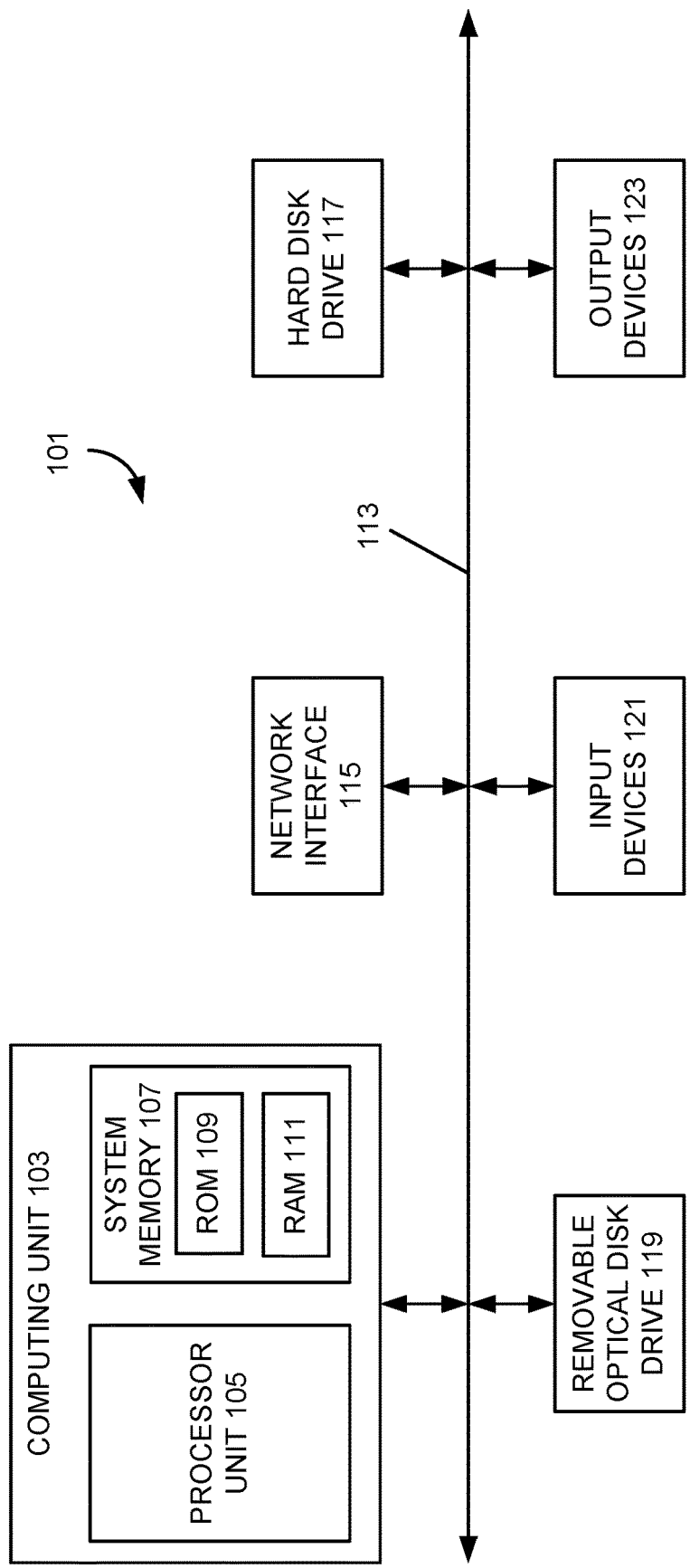
FIGS. 1 and 2 illustrate an example of a computer system of the type that may be used to implement various embodiments.

Various examples of the invention may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments of the invention may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
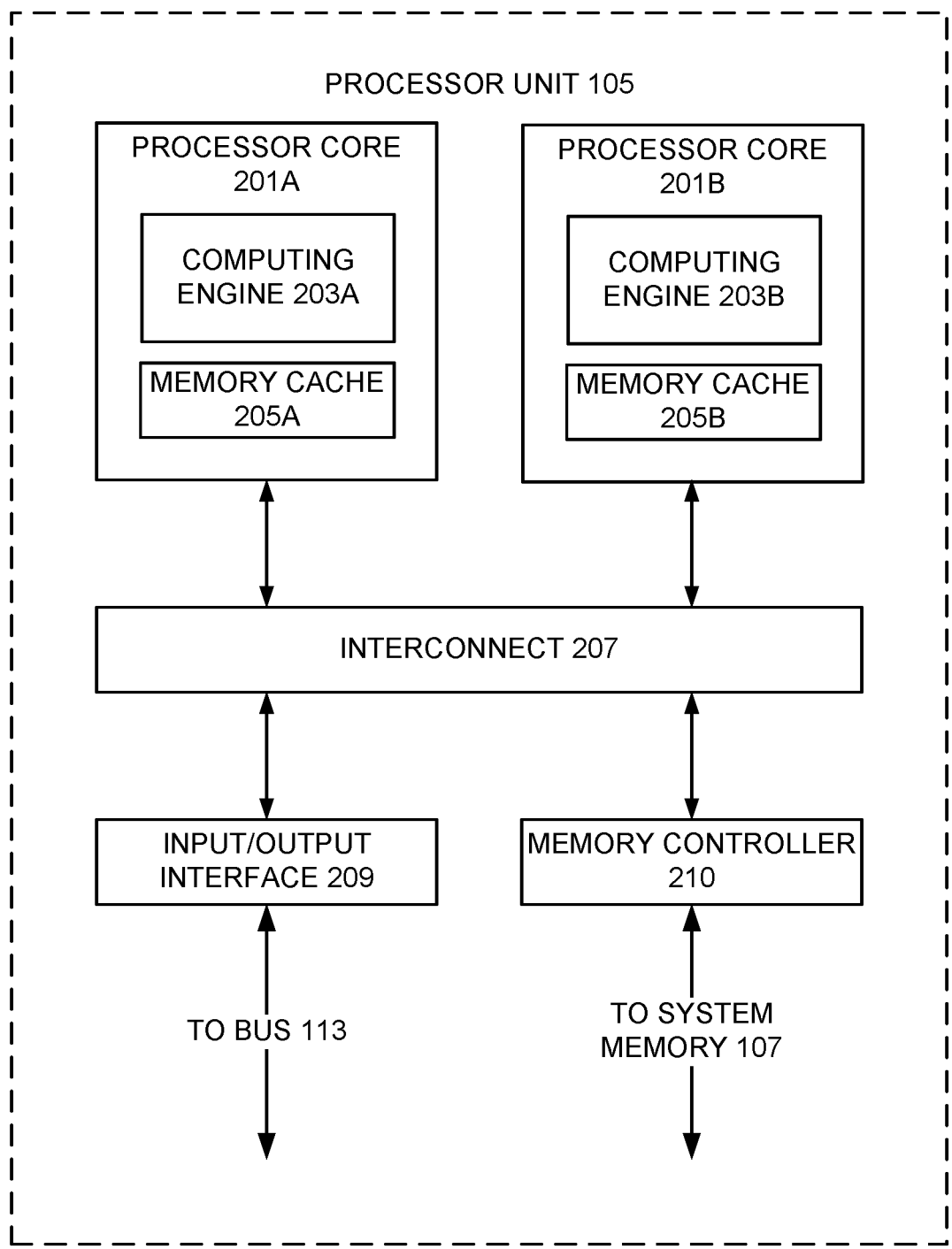

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations of the invention, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Functional Verification with Machine Learning

Figure 3:
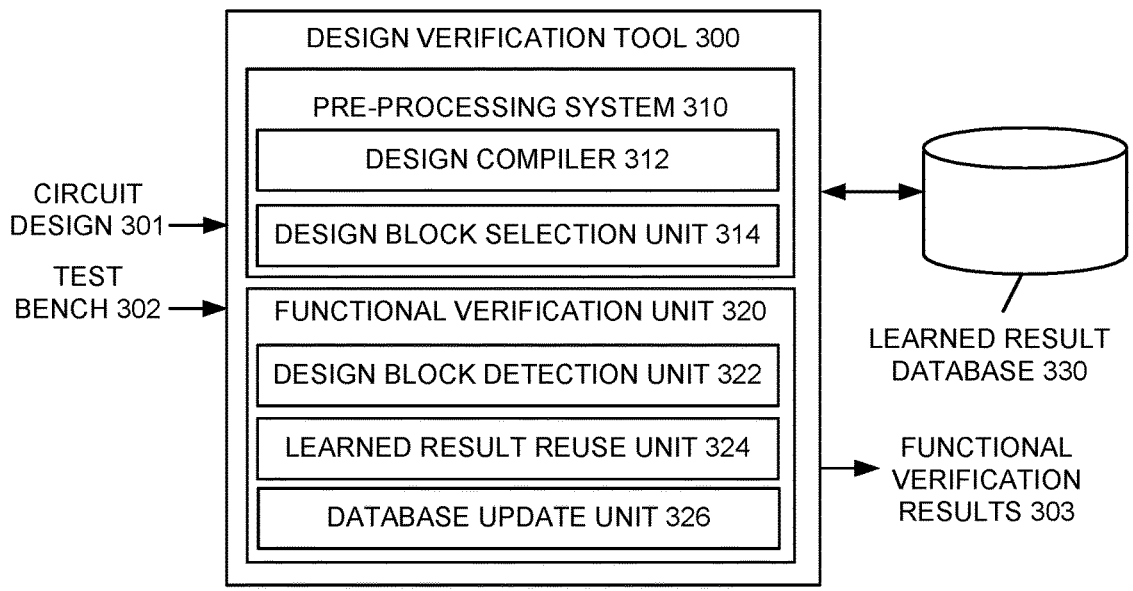
FIG. 3 illustrates an example of a design verification tool for functional verification of a circuit design with machine learning that may be implemented according to various embodiments.

FIG. 3 illustrates an example of a design verification tool 300 for functional verification of a circuit design 301 with machine learning that may be implemented according to various embodiments. Referring to FIG. 3, the design verification tool 300 can be implemented in an emulation system, a simulation system, a combination thereof, or the like, which can functionally verify the circuit design 301. The emulation system can implement the design verification tool 300 with one or more hardware emulators configured to emulate an electronic system corresponding to the circuit design 301. The simulation system can implement the design verification tool 300 with one or more processors configured to simulate an electronic system corresponding to the circuit design 301.

The design verification tool 300 can receive the circuit design 301, which can describe an electronic device both in terms of an exchange of data signals between components in the electronic device, such as hardware registers, flip-flops, combinational logic, or the like, and in terms of logical operations that can be performed on the data signals in the electronic device. The circuit design 301 can model the electronic device at a register transfer level (RTL), for example, with code in a hardware description language (HDL), such as Very high speed integrated circuit Hardware Design Language (VHDL), System C, or the like. In some embodiments, the design verification tool 300 can receive the circuit design 301 from a source external to the design verification tool 300, such as a user interface of the computer network 101, another tool implemented by the computer network 101, or the design verification tool 300 may generate the circuit design 301 internally.

The design verification tool 300 can receive a test bench 302 capable of defining test stimulus, for example, clock signals, activation signals, power signals, control signals, and data signals that, when grouped, may form test bench transactions capable of prompting operation of the circuit design 301 in a verification environment, such as a simulation environment or an emulation environment. In some embodiments, the test bench 302 can be written in an object-oriented programming language, for example, SystemVerilog or the like, which, when executed during elaboration, can dynamically generate test bench components for verification of the circuit design 301. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench 302. In some embodiments, the design verification tool 300 can receive the test bench 302 from a source external to the design verification tool 300, such as a user interface of the computer network 101, another tool implemented by the computer network 101, or the design verification tool 300 may generate the test bench 302 internally.

The design verification tool 300 can include a pre-processing system 310 to compile the circuit design 301 and the test bench 302, and to elaborate the compiled-versions of the circuit design 301 and the test bench 302 into a format usable in a verification environment. The pre-processing system 310 also can identify portions of the circuit design 301 that correspond to design blocks, and select one or more of the design blocks to utilize for machine learning during functional verification of the circuit design 301.

The pre-processing system 310 can include a design compiler 312 to compile and elaborate the circuit design 301 and the test bench 302. The design compiler 312 can generate design files, for example, coded in a C-based programming language, which can embody the circuit design 301 and the test bench 302. The design compiler 312 can check the circuit design 301 and the test bench 302 for syntax errors and issue any warnings in response to an identification of the syntax errors or other issues with the format of the circuit design 301 and/or the test bench 302. In some embodiments, the design compiler 312 can identify library components in the test bench 302, for example, standardized UVM library components, or the like. The elaboration process can instantiate objects, classes, or the like, in the compiled-versions of the circuit design 301 and the test bench 302 to prepare the circuit design 301 and the test bench 302 for functional verification in the verification environment.

The pre-processing system 310 can include a design block selection unit 314 to parse the circuit design 301 to identify design blocks in the circuit design 301 and their associated operational characteristics. The design block selection unit 314 can select one or more of the design blocks for machine learning during functional verification based, at least in part, on the operational characteristics of the design blocks. For example, the design block selection unit 314 can detect when design blocks have operational characteristics that are non-isolating and exclude them from selection. In some embodiments, the non-isolating operational characteristics for design blocks can include when the design blocks include hierarchical references, include display statements configured to output information during functional verification operations, are enabled for coverage in the verification environment, or the like. The design block selection unit 314 also can select one or more of the design blocks based on a predicted frequency that the design blocks will be exercised during functional verification in the verification environment.

The design block selection unit 314, in some embodiments, can flag the design blocks based on the selection, which can allow for their identification during functional verification operations. For example, the design block selection unit 314 can insert flags into the circuit design 301 corresponding to the selected design blocks. The design block selection unit 314 also may generate a list of the selected design blocks, which can be referenced during functional verification operations.

The design block selection unit 314 can build verification records for the selected design blocks, which can be stored in a learned result database 330. In some embodiments, the verification records can include an identifier of the selected design block and an input-output mapping. The input-output mapping initially may be empty and subsequently be populated based on functional verification operations performed by the selected design block. When populated, the input-output mapping can identify input stimulus received by the selected design block during functional verification operations, which can be paired with an output generated by the selected design block in response to the input stimulus during functional verification. The input-output mapping also can include a state of the selected design block when generating the output during functional verification. In some embodiments, the input-output mapping can be at least partially pre-populated based on functional verifications performed on a different circuit design 301, performed by a different design verification tool, or the like. Embodiments of the results reuse records for the selected design blocks will be described in greater detail below in FIG. 4.

Figure 4:
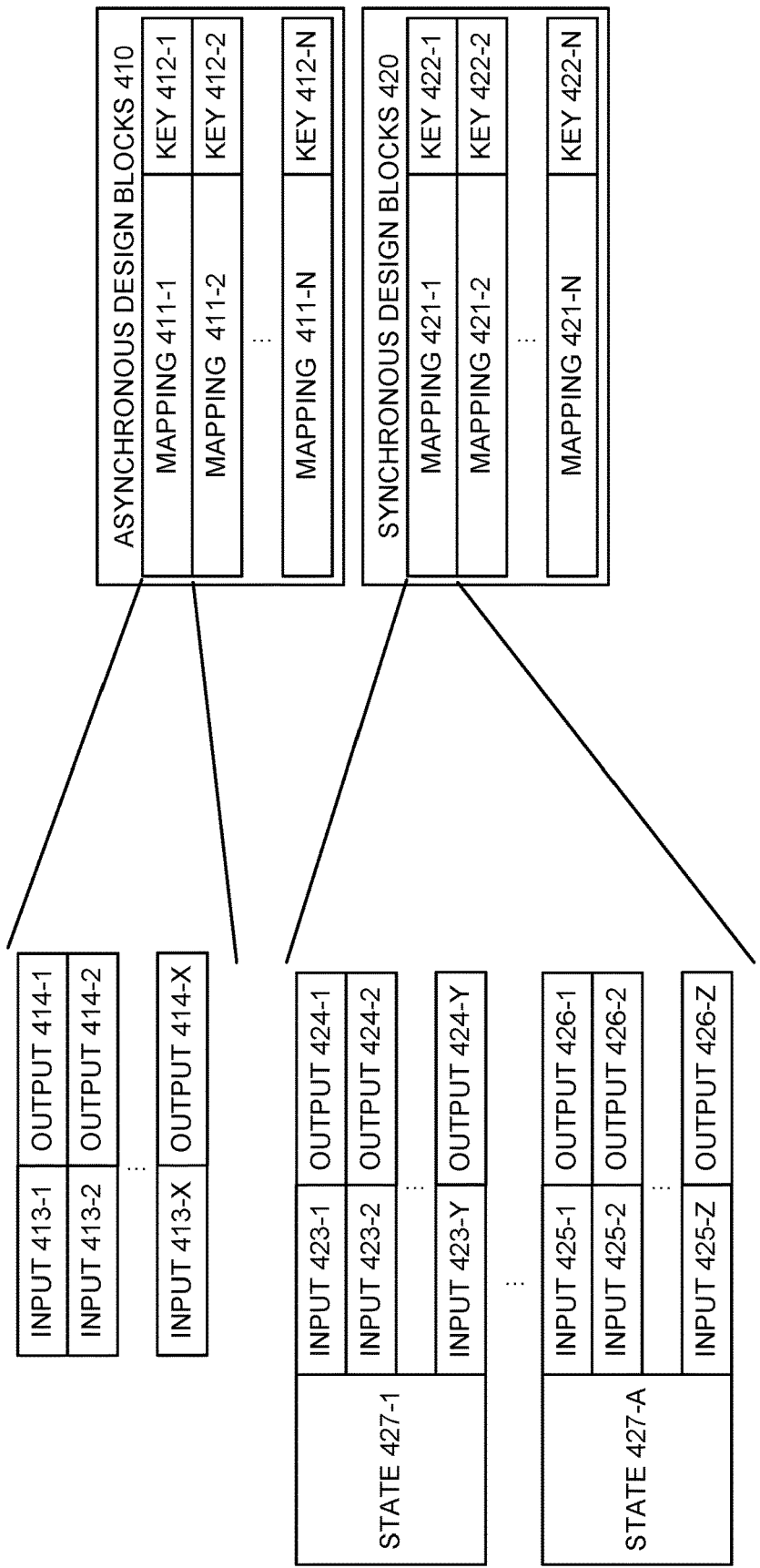
FIG. 4 illustrates an example implementation of a learned result database according to various examples.

FIG. 4 illustrates an example format of a learned result database 400 according to various examples. Referring to FIG. 4, the learned result database 400 can include a section for asynchronous design blocks 410 in the circuit design and a section for synchronous design blocks 420 in the circuit design. The section for the asynchronous design blocks 410 can include multiple database entries including identifiers of asynchronous design blocks in the circuit design, such as keys 412-1 to 412-N. The keys 412-1 to 412-N can include unique or near-unique identifiers for the asynchronous design blocks in the circuit design. The multiple database entries also can include input-output mappings, such as mappings 411-1 to 411-N, for each of the asynchronous design blocks in the circuit design. Each of the mappings 411-1 to 411-N can include a separate entry for each combination of input stimulus and output result of the asynchronous design blocks having been simulated or emulated in a verification environment. For example, the mapping 411-1 can include inputs 413-1 to 413-X corresponding to input stimulus, which can have corresponding outputs 414-1 to 414-X corresponding to output results.

The section for the synchronous design blocks 420 can include multiple database entries including identifiers of synchronous design blocks in the circuit design, such as keys 422-1 to 422-N. The keys 422-1 to 422-N can include unique or near-unique identifiers for the synchronous design blocks in the circuit design. The multiple database entries also can include input-output mappings, such as mappings 421-1 to 421-N, for each of the synchronous design blocks in the circuit design. Each of the mappings 421-1 to 421-N can include a separate entry for each combination of operational state, input stimulus, and output result of the synchronous design blocks having been simulated or emulated in a verification environment. For example, the mapping 421-1 can include multiple operational states, such as states 427-1 to 427-A, each of which can have entries corresponding to a combination of input stimulus and output results. The state 427-1 can include inputs 423-1 to 423-Y corresponding to input stimulus, which can have corresponding outputs 424-1 to 424-Y corresponding to output results. The state 427-A can include inputs 425-1 to 425-Z corresponding to input stimulus, which can have corresponding outputs 426-1 to 426-Z corresponding to output results.

Although FIG. 4 shows an example format for the learned result database 400 having entries with design block identifiers and input-output mappings, in some embodiments, the learned result database 400 can have any format that allows identification of output verification results for a design block based on a design block identification, an input stimulus, and possibly an operational state of the design block.

Referring back to FIG. 3, the design verification tool 300 can include a functional verification unit 320 to implement a verification environment, which can simulate, emulate, and/or prototype the circuit design 301 and the test bench 302 based on the compiled code from the design compiler 312. In some embodiments, the functional verification unit 320 can include a simulator to simulate the functional operations performed by the circuit design 301 in response to test stimulus generated by the test bench 302. The functional verification unit 320 can include a hardware emulator to emulate the circuit design 301 with programmable hardware, such as arrays of field programmable gate array (FPGA) chips, arrays of processors, a combination thereof, or the like.

The functional verification unit 320 can generate functional verification results 303 including waveform data corresponding to the functional operation of the circuit design 301 in the verification environment in response to test stimulus generated by the test bench 302. The design verification tool 300 (or a tool external to the design verification tool 300) can perform a functional verification of the circuit design 301, for example, by comparing the waveform data with an expected output from the circuit design 301 in response the test stimulus generated by the test bench 302.

The functional verification unit 320 can include a design block detection unit 322 to identify a next design block in the circuit design 301 to be executed or implemented in the verification environment. The design block detection unit 322 can determine whether the identified design block was selected for machine learning by the design block selection unit 314. In some embodiments, the design block detection unit 322 can determine the identified design block was selected for machine learning by the design block selection unit 314 by identifying the next design block was flagged in the circuit design 301. The design block detection unit 322 can determine the identified design block was selected for machine learning by the design block selection unit 314 by comparing the identified design block against the list of selected design blocks or against the verification records in the learned result database 330.

The functional verification unit 320 can include a learned result reuse unit 324 to identify an input stimulus to be provided to the next design block, and determine whether the next design block has been previously simulated or emulated with the input stimulus. In some embodiments, the learned result reuse unit 324 can access the learned result database 330 at least with an identifier of the next design block and the input stimulus to determine whether the next design block has been previously simulated or emulated with the input stimulus. The learned result reuse unit 324 also can utilize an operational state of the next design block, for example, when the next design block is a synchronous design block in the circuit design 301, in the access of the learned result database 330.

When the learned result reuse unit 324 determines the next design block has been previously simulated or emulated with the input stimulus or a combination of operational state and input stimulus, the learned result reuse unit 324 can prompt the functional verification unit 320 to bypass or skip the simulation or emulation of the next design block. The learned result reuse unit 324 can identify the result or output previously generated by the next design block in response to the input stimulus, and have the functional verification unit 320 utilize the identified result as the output of the next design block in response to the input stimulus. For example, the learned result reuse unit 324 can utilize the input-output mapping in the learned result databased 330 to identify the result or output previously generated by the next design block in response to the input stimulus. The functional verification unit 320 can populate the functional verification results 303 with the identified result.

When the learned result reuse unit 324 determines the next design block has not been previously simulated or emulated with the input stimulus or a combination of operational state and input stimulus, the learned result reuse unit 324 can allow the functional verification unit 320 to simulate or emulate the next design block and capture the result or output generated by the next design block in response to the input stimulus. The functional verification unit 320 can populate the functional verification results 303 with the captured result.

The functional verification unit 320 can include a database update unit 326 to modify a verification record corresponding to the next design block that was simulated or emulated. The database update unit 326 can update the input-output mapping for the next design block to associate the input stimulus to the result or output generated by the next design block in response to the input stimulus.

Figure 5:
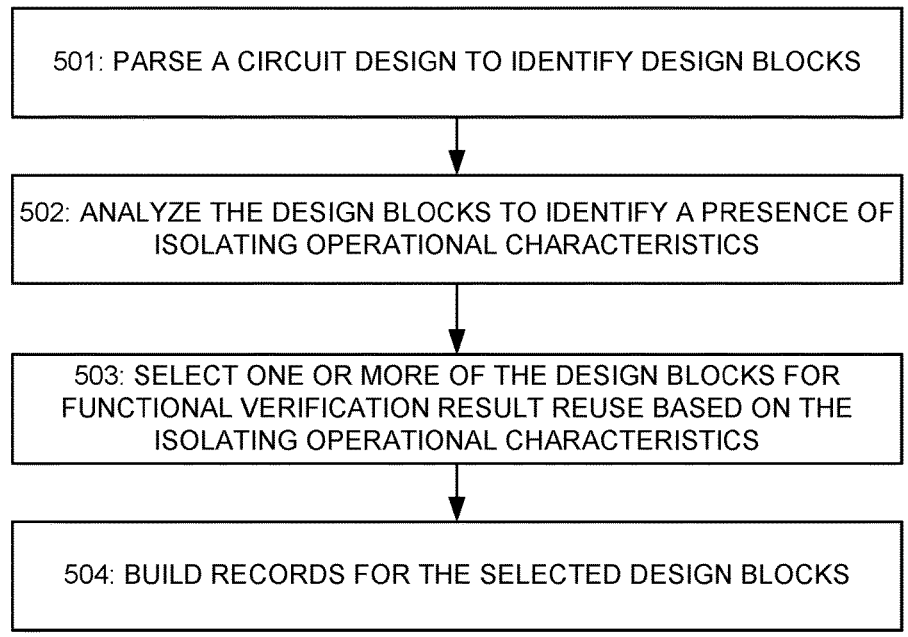
FIG. 5 illustrates a flowchart showing an example implementation for design block selection for functional verification with machine learning according to various examples.

FIG. 5 illustrates a flowchart showing an example implementation for design block selection for functional verification with machine learning according to various examples. Referring to FIG. 5, in a block 501, a design verification tool can parse a circuit design to identify design blocks. The circuit design can be arranged in a hierarchical structure. For example, the circuit design can be divided into low-level design units that may include basic functional elements of the circuit design, medium-level design units that may then include one or more of the low-level design units, and a high-level design units that may include one or more of the medium-level design units, and so on. The hierarchy of the circuit design can be represented in a tree diagram, with leaf nodes in the tree diagram corresponding to low-level design units, with medium-level and high-level design units corresponding to one or more leaf nodes and branches in the tree diagram.

The design verification tool can parse the circuit design to identify the hierarchical structure of the circuit design, for example, as represented in a tree diagram, traverse the tree diagram, for example, starting at leaf nodes, to determine the design blocks in the circuit design. For example, the design verification tool can analyze a leaf node to identify the operational characteristics of the low-level design unit corresponding to the leaf node, and then attempt to combine the low-level design unit with a medium-level design unit based on a similarity in operational characteristics between the design units. The design verification tool can perform the traversal of the hierarchy of design units to identify the design blocks, each of which can include one or more of the design units.

In a block 502, the design verification tool can analyze the design blocks to identify a presence of isolating operational characteristics, and in a block 503, the design verification tool can select one or more of the design blocks for functional verification result reuse based on the isolating operational characteristics. The design verification tool can determine whether the identified operational characteristics have isolating characteristics. For example, the operational characteristics for design blocks can have non-isolating characteristics when they include hierarchical references to other design groups, include display statements configured to output information during functional verification operations, are enabled for coverage in the verification environment, or the like. The design verification tool can exclude design blocks having non-isolating characteristics from selection.

In a block 504, the design verification tool can build records for the selected design blocks. In some embodiments, the records can include an identifier of the selected design block and an input-output mapping. The input-output mapping initially may be empty and subsequently be populated based on functional verification operations performed by the selected design block. When populated, the input-output mapping can identify input stimulus received by the selected design block during functional verification operations, which can be paired with an output generated by the selected design block in response to the input stimulus during functional verification. The input-output mapping also can include a state of the selected design block when generating the output during functional verification. The design verification tool can store the records in a learned result database.

Figure 6:
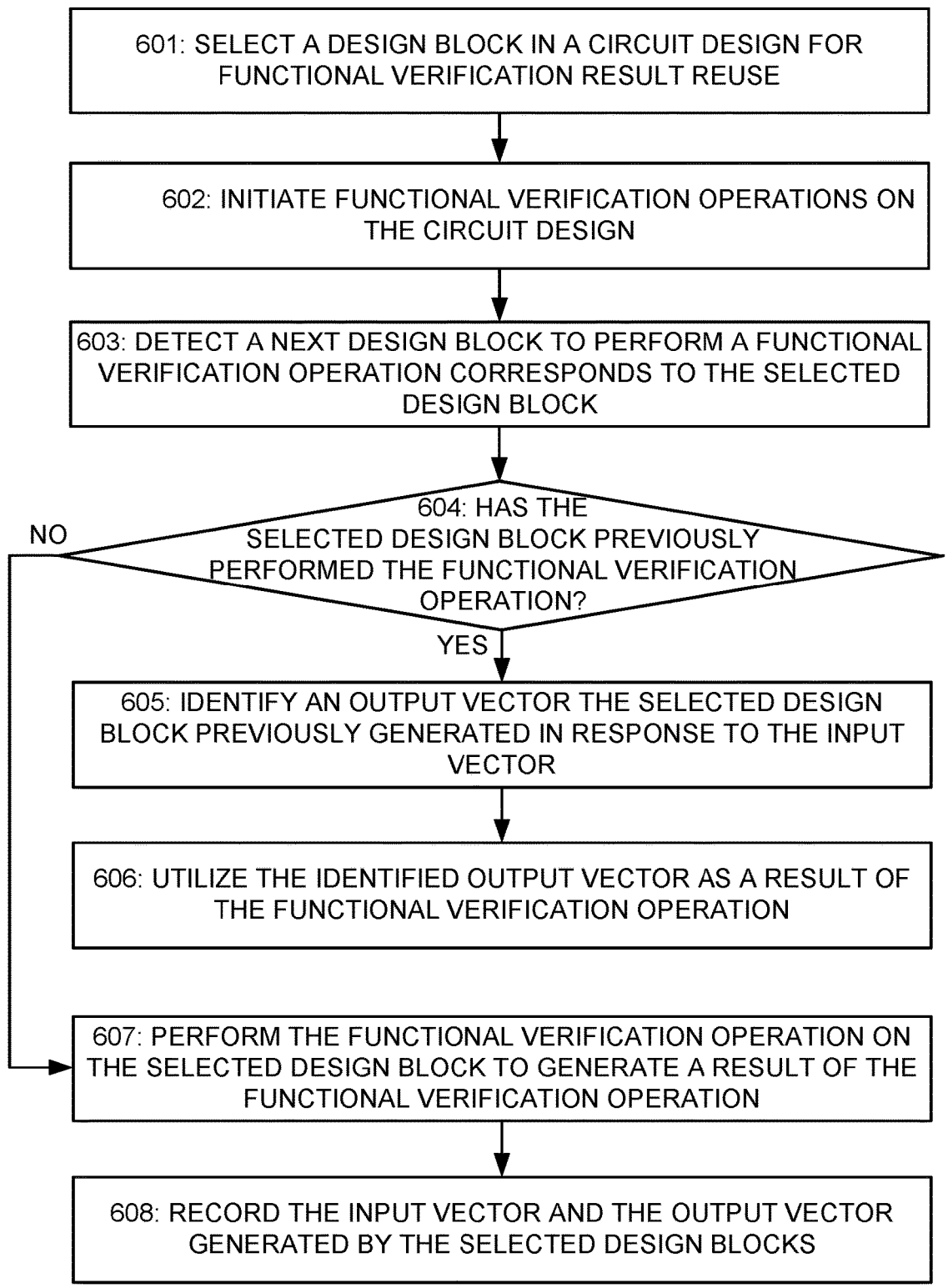
FIG. 6 illustrates a flowchart showing an example functional verification of a circuit design with selective result reuse according to various examples.

FIG. 6 illustrates a flowchart showing an example functional verification of a circuit design with selective result reuse according to various examples. Referring to FIG. 6, in a block 601, a design verification tool can select a design block in a circuit design for functional verification result reuse. The design verification tool can identify operational characteristics of the design blocks in the circuit design and select the design block for functional verification result reuse based, at least in part, on the operational characteristics of the design blocks. For example, the design verification tool can exclude design blocks have non-isolating operational characteristics from selection. In some embodiments, the non-isolating operational characteristics for design blocks can include when the design blocks include hierarchical references to other design block hierarchies in the circuit design, include display statements configured to output information during functional verification operations, are enabled for coverage in the verification environment, or the like. The design verification tool also can select the design block based on a predicted frequency that the design blocks will be exercised during functional verification in the verification environment.

The design verification tool, in some embodiments, can flag the selected design block, which can allow for its subsequent identification during functional verification operations. For example, the design verification tool can insert a flag into the circuit design corresponding to the selected design block or may add an identification of the selected design block to a list, which can be referenced during functional verification operations.

In a block 602, the design verification tool can initiate functional verification operations on the circuit design. The design verification tool can implement a verification environment, which can simulate, emulate, and/or prototype the design blocks in the circuit design and a test bench. In the verification environment, the test bench may generate test stimulus that, when provided to the circuit design, can prompt the circuit design to perform functional operations, which can be recorded by the design verification tool.

In a block 603, the design verification tool can detect a next design block to perform a functional verification operation corresponds to the selected design block. In some embodiments, the design verification tool can detect the next design block corresponds to the selected design block by identifying the next design block was flagged in the circuit design. The design verification tool also can detect the next design block corresponds to the selected design block by comparing the next design block against the list of selected design blocks or against records in the learned result database.

In a block 604, the design verification tool can determine whether the selected design block has previously performed the functional verification operation. The design verification tool can identify an input vector to be provided to the selected design block in the functional verification operations, and determine whether the selected design block has been previously performed the functional verification operation, for example, received the input vector during simulation or emulation. In some embodiments, the design verification tool can access the learned result database at least with an identifier of the selected design block and the input vector to determine whether the selected design block has been previously simulated or emulated and received the input vector. The design verification tool also can utilize an operational state of the selected design block, for example, when the selected design block is a synchronous design block in the circuit design, in the access of the learned result database.

When, in block 604, the design verification tool determines the selected design block previously performed the functional verification operation, the design verification tool, in a block 605, can identify an output vector the selected design block previously generated in response to the input vector. The design verification tool also can bypass or skip performing the functional verification operation, such as a simulation or emulation of the selected design block. In some embodiments, the design verification tool can identify an output vector the selected design block previously generated in response to the input vector by utilizing an identification of the selected design block, the input vector, and possibly the operational state of the selected design block to determine the output vector from an input-output mapping in the learned result database.

In a block 606, the design verification tool can utilize the identified output vector as a result of the functional verification operation. The design verification tool can generate function verification results, which can include waveform data corresponding to the operations of the circuit design in the verification environment. The design verification tool can utilize the identified output vector as a portion of the function verification results corresponding to the selected design block.

When in block 603, the design verification tool determines the selected design block has not previously performed the functional verification operation, the design verification tool, in a block 607, can perform the functional verification operation on the selected design block to generate a result of the functional verification operation and, in a block 608, the design verification tool can record the input vector and the output vector generated by the selected design blocks. The design verification tool can simulate or emulate the selected design block, which can provide the input vector to the simulated or emulated the selected design block. The design verification tool can capture the result or output generated by the selected design block in response to the input vector. The design verification tool can populate the functional verification results corresponding to the selected design block with the captured result. In some embodiments, the design verification tool can update the learned result database, for example, generating a new entry in the database corresponding to the selected design block that includes a mapping between the input vector and the output vector. The mapping also can include a relationship between the operational state of the design block, the input vector, and the output vector.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    selecting, by a computing system, a design block in a circuit design of an electronic device for functional verification result reuse;
    detecting, by the computing system, the selected design block is to be simulated with input stimulus;
    when the selected design block was previously simulated with the input stimulus, bypassing, by the computing system, the simulation of the design block, identifying, by the computing system, an output generated in a previous simulation of the selected design block in response to the input stimulus based on a mapping stored in a database that correlates a combination of the selected design block and the input stimulus with the output generated in the previous simulation of the selected design block, and utilizing, by the computing system, the identified output as a result for the simulation of the design block; and
    when the selected design block was not previously simulated with the input stimulus, simulating, by the computing system, the selected design block with the input stimulus, and modifying the mapping stored in the database to include an entry correlating the combination of the selected design block and the input stimulus to an output generated in the simulation of the selected design block with the input stimulus.

2. The method of claim 1, wherein selecting the design block is based, at least in part, on isolating operational characteristics of the design block.

3. The method of claim 2, wherein the isolating operational characteristics include at least one of includes a hierarchical reference to at least another design block in the circuit design, enables functional verification coverage, or includes a display statement.

4. The method of claim 1, wherein the identification the output is based, at least in part, on the input stimulus and a state of the selected design block during a different function verification operation.

5. The method of claim 1, further comprising storing, by the computing system, the output generated in the simulation of the selected design block in the database.

6. The method of claim 1, further comprising de-selecting the selected design block based, at least in part, on a frequency that the selected design block is to be simulated.

7. A system comprising:
    a memory system configured to store computer-executable instructions; and
    a computing system, in response to execution of the computer-executable instructions, is configured to:
        select a design block in a circuit design of an electronic device for functional verification result reuse;

detect the selected design block is to be simulated with input stimulus;

when the selected design block was previously simulated with the input stimulus, bypass the simulation of the design block, identify an output generated in a previous simulation of the selected design block in response to the input stimulus based on a mapping stored in a database that correlates a combination of the selected design block and the input stimulus with the output generated in the previous simulation of the selected design block, and utilize the identified output as a result for the simulation of the design block; and when the selected design block was not previously simulated with the input stimulus, simulate the selected design block with the input stimulus and modify the mapping stored in the database to include an entry correlating the combination of the selected design block and the input stimulus to an output generated in the simulation of the selected design block with the input stimulus.

8. The system of claim 7, wherein selecting the design block is based, at least in part, on isolating operational characteristics of the design block.

9. The system of claim 8, wherein the isolating operational characteristics include at least one of includes a hierarchical reference to at least another design block in the circuit design, enables functional verification coverage, or includes a display statement.

10. The system of claim 7, wherein the identification the output is based, at least in part, on the input stimulus and a state of the selected design block during a different function verification operation.

11. The system of claim 7, wherein the computing system, in response to execution of the computer-executable instructions, is further configured to store the output generated in the simulation of the selected design block in the database.

12. An apparatus comprising at least one computer-readable memory device storing instructions configured to cause one or more processing devices to perform operations comprising:

selecting a design block in a circuit design of an electronic device for functional verification result reuse;

detecting the selected design block is to be simulated with input stimulus; and when the selected design block was previously simulated with the input stimulus, bypassing the simulation of the design block, identifying an output generated in a previous simulation of the selected design block in response to the input stimulus based on a mapping stored in a database that correlates a combination of the selected design block and the input stimulus with the output generated in the previous simulation of the selected design block, and utilizing the identified output as a result for the simulation of the design block; and when the selected design block was not previously simulated with the input stimulus, simulating the selected design block with the input stimulus and modifying the mapping stored in the database to include an entry correlating the combination of the selected design block and the input stimulus to an output generated in the simulation of the selected design block with the input stimulus.

13. The apparatus of claim 12, wherein selecting the design block is based, at least in part, on isolating operational characteristics of the design block.

14. The apparatus of claim 13, wherein the isolating operational characteristics include at least one of includes a hierarchical reference to at least another design block in the circuit design, enables functional verification coverage, or includes a display statement.

15. The apparatus of claim 12, wherein the identification the output is based, at least in part, on the input stimulus and a state of the selected design block during a different function verification operation.

16. The apparatus of claim 12, wherein the instructions are configured to cause one or more processing devices to perform operations further comprising storing the output generated in the simulation of the selected design block for functional verification result reuse.

17. The apparatus of claim 12, wherein the instructions are configured to cause one or more processing devices to perform operations further comprising de-selecting the selected design block based, at least in part, on a frequency that the selected design block is to be simulated.

* * * * *